United States Patent [19]

Sugio et al.

[11] Patent Number: 5,825,215
[45] Date of Patent: Oct. 20, 1998

[54] OUTPUT BUFFER CIRCUIT

[75] Inventors: Kenichiro Sugio; Tetsuya Mitoma, both of Miyazaki, Japan

[73] Assignee: Oki Electric Industry Co., Ltd., Tokyo, Japan

[21] Appl. No.: 808,255

[22] Filed: Feb. 28, 1997

[30] Foreign Application Priority Data

Mar. 21, 1996 [JP] Japan .................................. 8-064040

[51] Int. Cl.$^6$ .................................................. H03K 3/01
[52] U.S. Cl. ........................ 327/108; 327/112; 327/379; 327/384; 327/389; 326/26; 326/27; 326/82; 326/83; 326/87
[58] Field of Search ................................ 326/21, 26, 27, 326/28, 82, 83, 87; 327/108, 112, 379, 384, 388, 389, 391

[56] References Cited

U.S. PATENT DOCUMENTS

| 5,001,369 | 3/1991 | Lee ........................................... 307/473 |
| 5,075,569 | 12/1991 | Branson ................... 307/270 |
| 5,341,338 | 8/1994 | Hashiguchi et al. ..................... 365/206 |
| 5,508,635 | 4/1996 | Kwon ........................................ 326/27 |
| 5,629,634 | 5/1997 | Carl et al. ................................. 326/27 |

FOREIGN PATENT DOCUMENTS

| 404168806 A | 6/1992 | Japan ........................................ 326/26 |
| 404326815 A | 11/1992 | Japan ........................................ 326/21 |
| 405083112 A | 4/1993 | Japan ........................................ 326/87 |
| 405191260 A | 7/1993 | Japan ........................................ 326/87 |

*Primary Examiner*—Timothy P. Callahan
*Assistant Examiner*—An T. Luu
*Attorney, Agent, or Firm*—Rabin & Champagne, P.C.

[57] ABSTRACT

An output buffer circuit of the present invention comprises a first input terminal receiving a first input signal, a second input terminal receiving a second input signal, a control input terminal receiving a control signal, an output terminal outputting an output signal, a first transistor coupled between the output node and a first potential source and a second transistor coupled between the output node and a second potential source. The output buffer of the present invention further includes a first gate circuit and a second gate circuit. The first gate circuit has a first input node coupled to receive the first input signal, a second input node coupled to receive the control signal, an enable input node coupled to receive the second input signal and an output node coupled to the control terminal of the first transistor. The first gate circuit outputs the signal received by the enable input node when the signals received by the first and second input nodes have predetermined level. The second gate circuit has a first input node coupled to receive the second input signal, a second input node coupled to receive the control signal, an enable input node coupled to receive the first input signal and an output node coupled to the control terminal of the first transistor. The second gate circuit has the same circuit configuration of the first gate circuit.

15 Claims, 5 Drawing Sheets

OUTPUT BUFFER CIRCUIT

BACKGROUND OF THE INVENTION

1. Field of the Invention

This invention relates to an output buffer circuit suitable for use in a semiconductor integrated circuit, and particularly to an output buffer circuit applicable to a synchronous DRAM.

2. Description of the Related Art

Since a synchronous DRAM activated in synchronism with a high-speed clock of about 100 MHz has a burst output mode for continuously outputting several bits of data (burst data), the access of an output buffer circuit, i.e., the operation thereof up to the output of a signal inputted thereto is made as fast as possible. Therefore, a problem arises that a through-current flows in the output of the output buffer circuit. In order to reduce the through-current, the conventional output buffer circuit is comprised of a three-input NAND gate and an output portion composed of a PMOS transistor and an NMOS transistor. These transistors are shifted in switching timing from each other.

However, the conventional output buffer circuit has a problem in that since a timing delay occurs because the switching timing of one transistor is shifted from that of another transistor, the access thereof at the time that a signal outputted from the output buffer circuit changes from "L" to "H", becomes slow. A further problem arises in that power noise produced when the PMOS transistor is turned ON, must be reduced.

SUMMARY OF THE INVENTION

It is an object of the present invention to speed up the access of an output buffer circuit at the time that a signal outputted therefrom changes from "L" to "H".

It is another object of the present invention to reduce power noise produced when an output PMOS transistor is turned ON.

An output buffer circuit of the present invention comprises a first input terminal receiving a first input signal, a second input terminal receiving a second input signal, a control input terminal receiving a control signal, an output terminal outputting an output signal, a first transistor coupled between the output node and a first potential source and a second transistor coupled between the output node and a second potential source. The output buffer of the present invention further includes a first gate circuit and a second gate circuit. The first gate circuit has a first input node coupled to receive the first input signal, a second input node coupled to receive the control signal, an enable input node coupled to receive the second input signal and an output node coupled to the control terminal of the first transistor. The first gate circuit outputs the signal received by the enable input node when the signals received by the first and second input nodes have predetermined level. The second gate circuit has a first input node coupled to receive the second input signal, a second input node coupled to receive the control signal, an enable input node coupled to receive the first input signal and an output node coupled to the control terminal of the first transistor. The second gate circuit has the same circuit configuration as the first gate circuit.

Typical ones of various embodiments of the invention of the present application have been shown in brief. However, the various embodiments of the present application and specific configurations of these embodiments will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
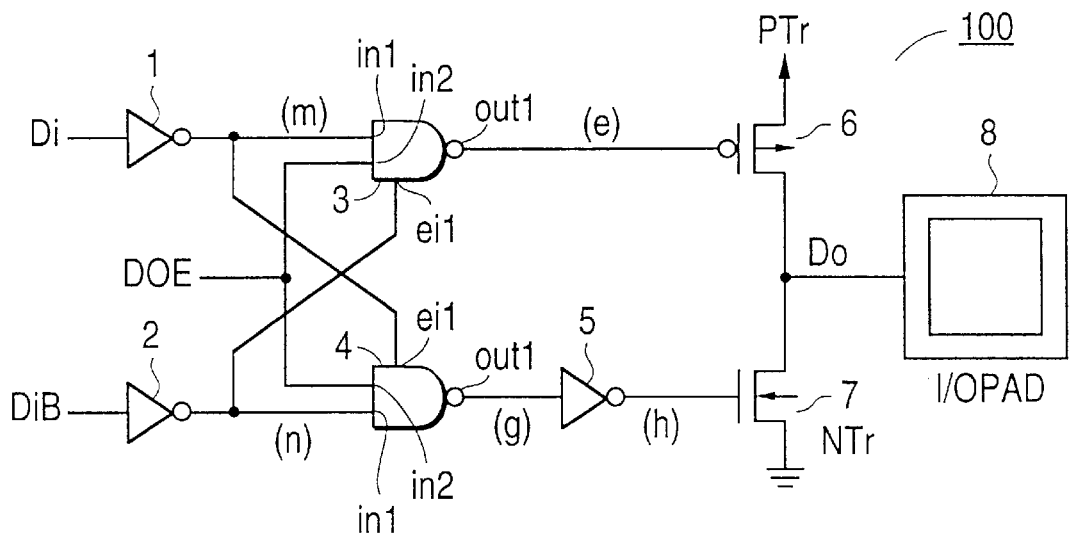
FIG. 1 is a circuit diagram showing an output buffer circuit according to a first embodiment of the present invention.

FIG. 1 is a circuit diagram showing an output buffer circuit according to a first embodiment of the present invention. The output buffer circuit 100 shown in FIG. 1 has a first inverter 1 supplied with an input signal Di and a second inverter 2 supplied with an input signal DiB. Further, the output buffer circuit 100 has a first NAND gate 3 having a first input terminal in electrically connected to an output terminal of the first inverter 1, a second input terminal in2 supplied with an output enable signal DOE and an enable input terminal ei1 electrically connected to an output terminal of the second inverter 2, and a second NAND gate 4 having a first input terminal in1 electrically connected to the output terminal of the second inverter 2, a second input terminal in2 supplied with the output enable signal DOE and an input terminal ei1 electrically connected to the output terminal of the first inverter 1. Moreover, the output buffer circuit 100 includes a third inverter 5 having an input terminal electrically connected to an output terminal of the second NAND gate 4, an output PMOS transistor 6 whose gate and source are respectively electrically connected to an output terminal of the first NAND gate 3 and a power source, and an output NMOS transistor 7 whose gate and drain are respectively electrically connected to an output terminal of the third inverter 5, the drain of the output PMOS transistor 6 and whose source is electrically grounded. A point at which the drain of the output PMOS transistor 6 and the drain of the output NMOS transistor 7 are connected to each other, is used as the output of the output buffer circuit 100. The output of the output buffer circuit 100 is electrically connected to an output pad 8.

Figure 2A:
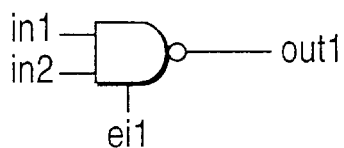
FIG. 2(a) and 2(b) are diagrams illustrating the configuration of a NAND gate employed in the output buffer circuit shown in FIG. 1.
Figure 2B:
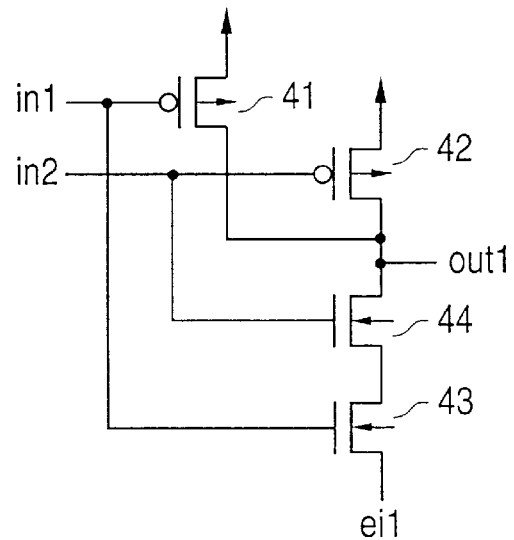

FIGS. 2(a) and 2(b) are diagrams showing the configurations of the first and second NAND gates 3 and 4, wherein FIG. 2(a) is a diagram showing the symbol of each NAND gate and FIG. 2(b) is a circuit diagram of each NAND gate. The source input-type NAND gate shown in FIG. 2(b) has a first PMOS transistor 41 whose gate, source and drain are respectively electrically connected to the first input terminal in1, a power source and the output terminal out1, and a second PMOS transistor 42 whose gate, source and drain are respectively electrically connected to the second input terminal in2, the power source and the drain of the first PMOS transistor 41. Further, the NAND gate has a first NMOS transistor 43 whose gate and source are respectively electrically connected to the gate of the first PMOS transistor 41 and the enable input terminal ei1, and a second NMOS transistor 44 whose gate, source and drain are respectively electrically connected to the gate of the second PMOS transistor 42, the drain of the first NMOS transistor 43 and the drain of the first PMOS transistor 41. The present NAND gate is identical in circuit configuration to a general-purpose two-input NAND gate except that the source of the first NMOS transistor 43 is not connected to a predetermined source potential. The NAND gate is activated so as to output an "L" level signal only when the first and second input terminals in1 and in2 are respectively supplied with an "H" level signal and the enable input terminal ei1 is supplied with an "L" level signal.

The number of elements of a general-purpose three-input NAND gate is nine, whereas the number of elements of each of the NAND gates 3 and 4 shown in FIG. 2 is four. Thus, an increase in dimensions of the respective elements under pattern areas equal to those of the general-purpose three-input NAND gate allows drive capabilities of the first and second NAND gates 3 and 4 shown in FIG. 1 to increase as compared with the general-purpose three-input NAND gate.

Figure 3:
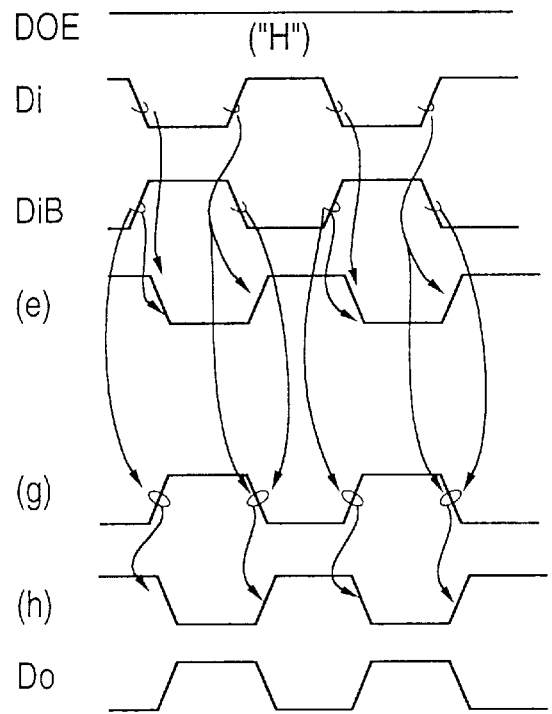
FIG. 3 is a timing chart for describing the operation of the output buffer circuit shown in FIG. 1.

FIG. 3 is a timing chart for explaining the operation of the output buffer circuit shown in FIG. 1 and illustrates the waveforms of an output enable signal DOE, first and second input signals Di and DiB, levels at internal nodes (e), (g) and (h) and an output signal Do.

A description will first be made of a case in which the first input signal Di changes from "H" to "L" (at this time, the second input signal DiB changes from "L" to "H"). The output enable signal DOE is "H". When the first input signal Di changes from "H" to "L" and the second input signal DiB changes from "L" to "H", the level at a node (m) changes from "L" to "H" and the level at a node (n) changes from "H" to "L".

Since the first PMOS transistor 41 of the second NAND gate 4 is turned ON when the level at the node (n) is determined to be "L", the level at the node (g) changes from "L" to "H" and the level at the node (h) changes from "H" to "L". As a result, the output NMOS transistor 7 is turned OFF. When the level at the node (m) is determined to be "H", the first PMOS transistor 41 of the first NAND gate 3 is turned OFF so that the level at the node (n) is determined as "L". Thus, since the enable input terminal ei1 is brought to "L" and the first and second NMOS transistors 43 and 44 are turned ON, the level at the node (e) changes from "H" to "L". As a result, the output PMOS transistor 6 is turned ON. Accordingly, the output signal Do makes an "L" to "H" transition.

At this time, the two NMOS transistors 43 and 44 of the first NAND gate 3 are both turned ON to change the level at the node (e) to "L". However, since they are series-connected to each other, the first NAND gate 3 is slower than the second NAND gate 4 in switching speed. Therefore, since the output PMOS transistor 6 is turned ON after the output NMOS transistor 7 has been turned OFF, a through-current flow can be limited.

A description will next be made of a case in which the first input signal Di makes an "L" to "H" transition (the second input signal DiB changes from "H" to "L" at this time). The output enable signal DOE is "H". When the first and second input signals Di and DiB respectively change from "L" to "H" and from "H" to "L", the level at the node (m) changes from "H" to "L" and the level at the node (n) changes from "L" to "H".

Since the first PMOS transistor 41 of the first NAND gate 3 is turned ON when the level at the node (m) is determined to be "L", the level at the node (e) changes from "H" to "L". As a result, the output PMOS transistor 6 is turned OFF. Further, the first PMOS transistor 41 of the second NAND gate 4 is turned OFF when the level at the node (n) is determined to be "H", so that the level at the node (m) is determined as the "L". Since the enable input terminal ei1 becomes "L" and hence the first and second NMOS transistors 43 and 44 are turned ON, the level at the node (g) changes from "H" to "L" and the level at the node (h) changes from "L" to "H". As a result, the output NMOS transistor 7 is turned ON. Accordingly, the output signal Do makes an "H" to "L" transition.

Since the level at the node (g) is changed to "L" by the two series-connected NMOS transistors 43 and 44 in the second NAND gate 4, the second NAND gate 4 is slower than the first NAND gate 3 in switching speed. Therefore, since the output NMOS transistor 7 is turned ON after the turning OFF of the output PMOS transistor 6, a through-current flow can be limited.

According to the first embodiment as described above, the two-input NAND gates 3 and 4 have been used in which the sources of the first NMOS transistors 43 are provided as the enable input terminals ei1 and their drive capabilities have been enhanced as compared with the three-input NAND gate under the same pattern area. Further, the output of the first NAND gate 3 is connected to the enable input terminal ei1 of the second NAND gate 4 and the output of the second NAND gate 4 is connected to the enable input terminal ei1 of the first NAND gate 3. Therefore, the first NAND gate 3 can directly drive the output PMOS transistor 6 while the through-current flow produced in the output MOS transistors is being limited in a manner equivalent to the prior art. Further, the number of logic stages can be reduced. Thus, the access time for the transition of the output signal Do from "L" to "H" can be made faster.

Figure 4:
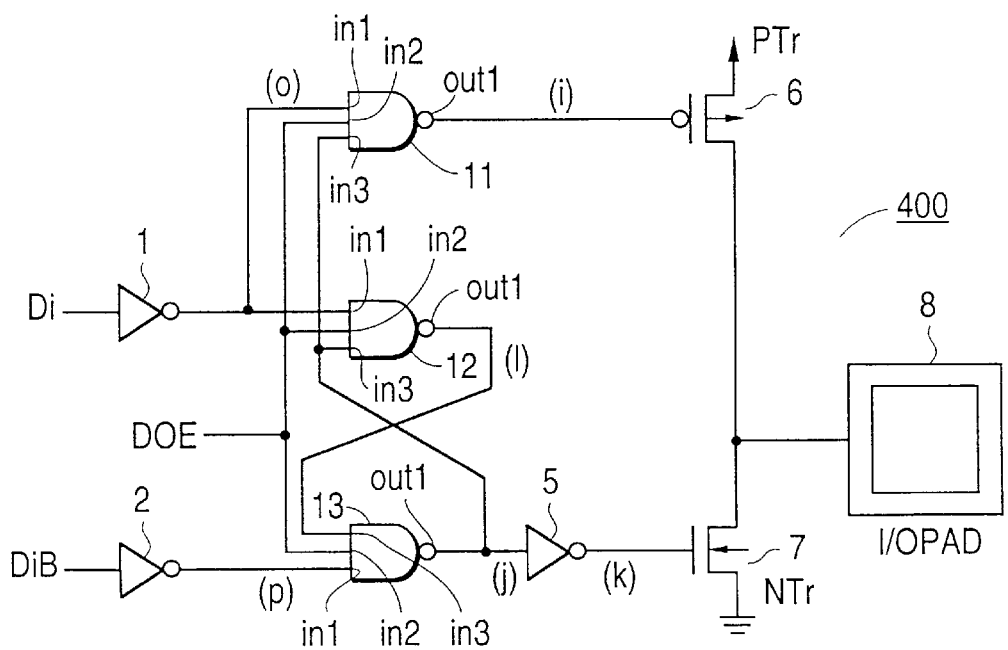
FIG. 4 is a circuit diagram showing an output buffer circuit according to a second embodiment of the present invention.

FIG. 4 is a circuit diagram showing an output buffer circuit according to a second embodiment of the present invention. The output buffer circuit 400 shown in FIG. 4 has a first inverter 1 supplied with a first input signal Di, and a second inverter 2 supplied with a second input signal DiB. Further, the output buffer circuit 400 includes a first NAND gate 11 having a first input terminal in1 electrically connected to an output terminal of the first inverter 1 and a second input terminal in2 supplied an output enable signal DOE, a second NAND gate 12 having a first input terminal in1 electrically connected to the output terminal of the first inverter 1 and a second input terminal in2 supplied with the output enable signal DOE, and a third NAND gate 13 having a first input terminal in1 electrically connected to an output terminal of the second inverter 2, a second input terminal in2 supplied with the output enable signal DOE, a third input terminal in3 electrically connected to an output terminal of the second NAND gate 12 and an output terminal electrically connected to third input terminals in3 of the first and second NAND gates 11 and 12. Moreover, the output buffer circuit 400 includes a third inverter 5 having an input terminal electrically connected to an output terminal of the third NAND gate 13, an output PMOS transistor 6 whose gate and source are respectively electrically connected to an output terminal of the first NAND gate 11 and a power source, and an output NMOS transistor 7 whose gate and drain are respectively electrically connected to an output terminal of the third inverter 5 and the drain of the output PMOS transistor 6 and whose source is grounded. A point at which the drain of the output PMOS transistor 6 and the drain of the output NMOS transistor 7 are connected to each other, is defined as the output of the output buffer circuit 400 and is electrically connected to an output pad 8.

Since the second NAND gate 12 simply drives the third NAND gate 13, elements that constitute the second NAND gate 12, are set so as to be small in dimension.

Figure 5:
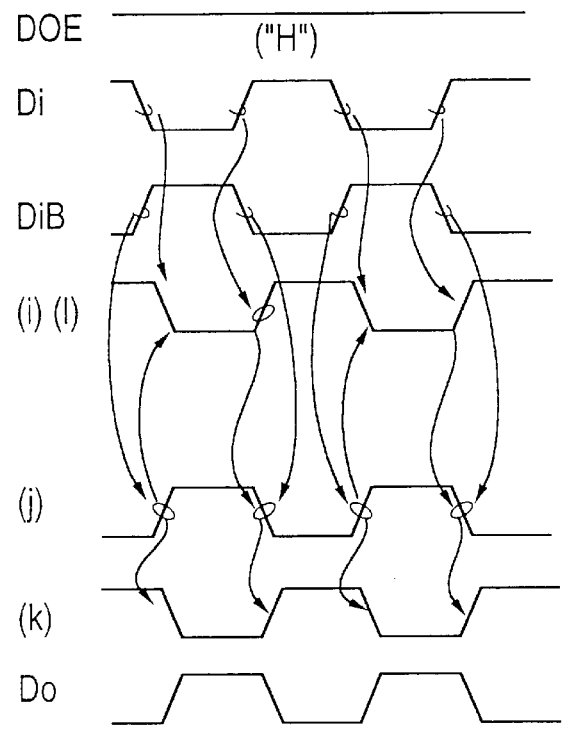
FIG. 5 is a timing chart for describing the operation of the output buffer circuit shown in FIG. 4.

FIG. 5 is a timing chart for describing the operation of the output buffer circuit shown in FIG. 4 and illustrates the waveforms of an output enable signal DOE, first and second input signals Di and DiB, levels at internal nodes (i), (1), (j) and (k), and an output signal Do.

A description will first be made of a case in which the first input signal Di changes from "H" to "L" (at this time the second input signal DiB changes from "L" to "H"). The output enable signal DOE is "H". When the first and second input signals Di and DiB change from "H" to "L" and from "L" to "H" respectively, the level at a node (o) changes from "L" to "H" and the level at a node (p) changes from "H" to "L".

When the node (p) makes an "L" transition, the node (j) corresponding to the output of the third NAND gate 13 goes "H". The level at the node (k) changes from "H" to "L" so that the output NMOS transistor 7 is turned OFF. On the other hand, when the node (j) takes an "H" transition, all the inputs of the first and second NAND gates 11 and 12 are rendered "H" so that the levels at the nodes (i) and (1) respectively change from "H" to "L". As a result, the output PMOS transistor 6 is turned ON. Accordingly, the output signal Do makes an "L" to "H" transition.

At this time, the first NAND gate 11 outputs an "L" level in response to the output of the third NAND gate 13. Thus, since the output PMOS transistor 6 is turned ON after the turning OFF of the output NMOS transistor 7, a through-current flow can be limited.

A description will next be made of a case in which the first input signal Di changes from "L" to "H" (at this time, the second input signal DiB changes from "H" to "L"). The output enable signal DOE is "H". When the first and second input signals Di and DiB change from "L" to "H" and from "H" to "L", the level at the node (o) changes from "H" to "L" and the level at the node (p) changes from "L" to "H".

When the node (o) is rendered "L" in level, the node (i) corresponding to the output of the first NAND gate 11 and the node (1) corresponding to the output of the second NAND gate 12 are respectively taken "H". As a result, the output PMOS transistor 6 is turned OFF. When the node (1) is rendered "H" in level, all the three inputs of the third NAND gate 13 are brought to "H" so that the level at the node (j) changes from "H" to "L" and the level at the node (k) changes from "L" to "H". As a result, the output NMOS transistor 6 is turned ON. Accordingly, the output signal Do changes from "H" to "L".

At this time, the first NAND gate 11 and the second NAND gate 12 are activated in the same timing. Since the third NAND gate 13 is activated in response to the output signal of the second NAND gate 12, the third NAND gate 13 is activated in the same timing as when the second NAND gate 12 is activated in response to the output signal of the first NAND gate 11. Thus, since the output NMOS transistor 7 is turned ON after the turning OFF of the output PMOS transistor 6, it is possible to limit the flow of a through-current.

According to the second embodiment as described above, the second NAND gate 12 activated in the same timing as the first NAND gate 11 is provided and the first NAND gate 11 is activated in response to the output signal of the third NAND gate 13. Since the third NAND gate 13 is activated in response to the output signal of the second NAND gate 12, the third NAND gate 13 can be considered to be activated indirectly in response to the output signal of the first NAND gate 11. Thus, since the load on the first NAND gate 11, which has heretofore driven the third NAND gate 13, can be reduced, the output PMOS transistor 6 can be directly driven by the first NAND gate 11 while the through-current flow produced in the output MOS transistors is being limited in the same manner as ever. Further, since drive circuits such as inverters or the like for enhancing drive capability can be reduced in number, the access time for the transition of the output signal Do from "L" to "H" can be made faster.

Figure 6:
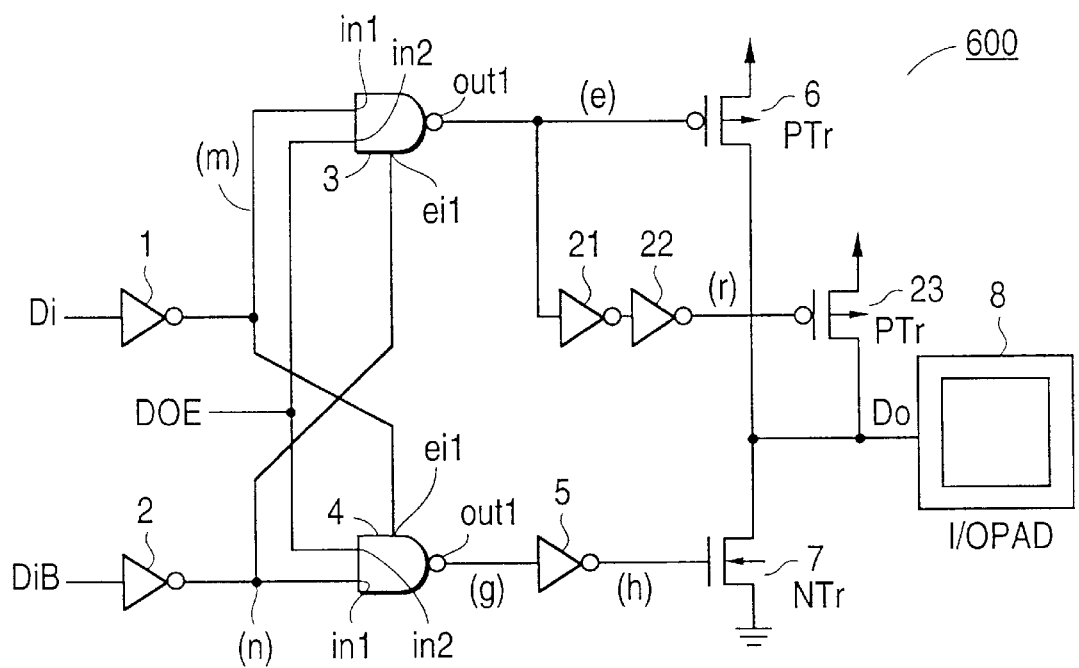
FIG. 6 is a circuit diagram illustrating an output buffer circuit according to a third embodiment of the present invention.

FIG. 6 is a circuit diagram showing an output buffer circuit according to a third embodiment of the present invention. The output buffer circuit 600 shown in FIG. 6 has a fourth inverter 21 having an input terminal electrically connected to an output terminal of a first NAND gate 3, a fifth inverter 22 having an input terminal electrically connected to an output terminal of the fourth inverter 21, and an additional output PMOS transistor 23 whose gate, source and drain are respectively electrically connected to an output terminal of the fifth inverter 22, a power source and the drain of an output PMOS transistor 6, all of which are additionally provided within the output buffer circuit 100 shown in FIG. 1.

Figure 7:
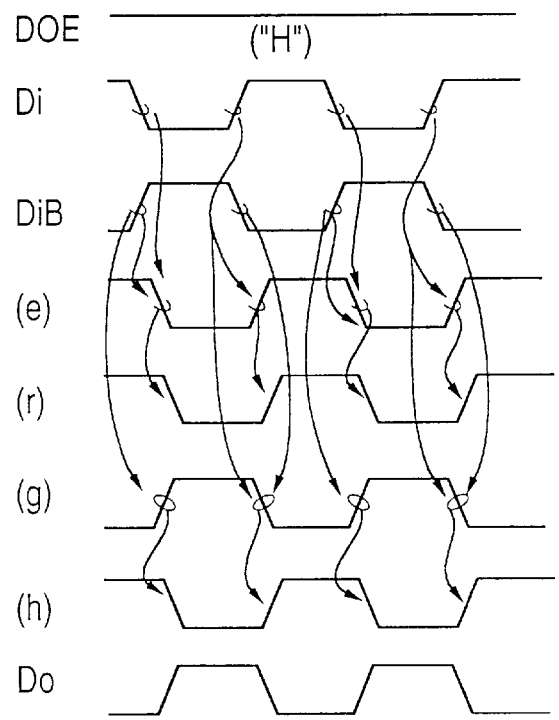
FIG. 7 is a timing chart for describing the operation of the output buffer circuit shown in FIG. 6.

The components other than the fourth and fifth inverters 21 and 22 and the addition output PMOS transistor 23 additionally provided in the present embodiment are similar in circuit operation to those employed in the first embodiment. Operations of the additionally provided components will be described below. FIG. 7 is a timing chart for describing the operation of the output buffer circuit 600 shown in FIG. 6. This drawing is one in which a waveform obtained at an internal node (r) has been added to the timing chart shown in FIG. 3.

When a first input signal Di changes from "H" to "L" and the level at a node (e) changes from "H" to "L", the level at the node (r) changes from "H" to "L", so that the addition output PMOS transistor 23 is turned ON. At this time, the timing provided to turn ON the addition output PMOS transistor 23 becomes slower than that provided to turn ON the output transistor PMOS 6 owing to a delay in signal by the fourth and fifth inverters 21 and 22.

According to the third embodiment as described above, power noise can be reduced by causing the two output PMOS transistors 6 and 23 to distribute, on a time basis, a current that flows when an output signal Do changes from "L" to "H".

Figure 8:
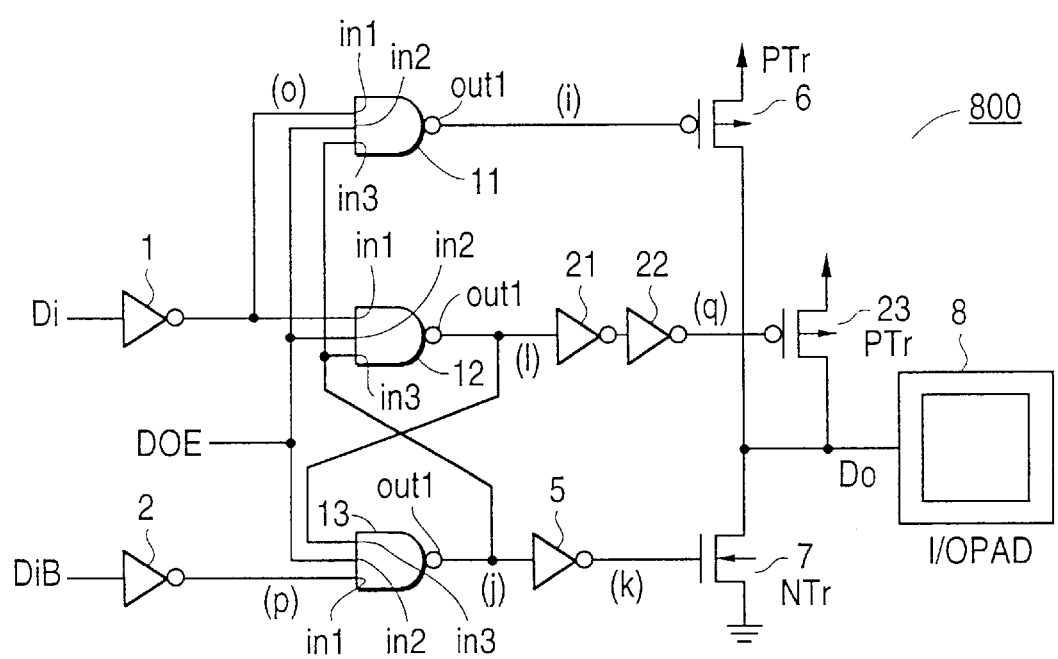
FIG. 8 is a circuit diagram depicting an output buffer circuit according to a fourth embodiment of the present invention.

FIG. 8 is a circuit diagram showing an output buffer circuit according to a fourth embodiment of the present invention. The output buffer circuit 800 shown in FIG. 8 is provided with a fourth inverter 21 having an input terminal electrically connected to an output terminal of a second NAND gate 12, a fifth inverter 22 having an input terminal electrically connected to an output terminal of the fourth inverter 21, and an additional output PMOS transistor 23 whose gate, source and drain are respectively electrically connected to an output terminal of the fifth inverter 22, a power source and the drain of an output PMOS transistor 6, all of which are additionally provided within the output buffer circuit shown in FIG. 4.

Figure 9:
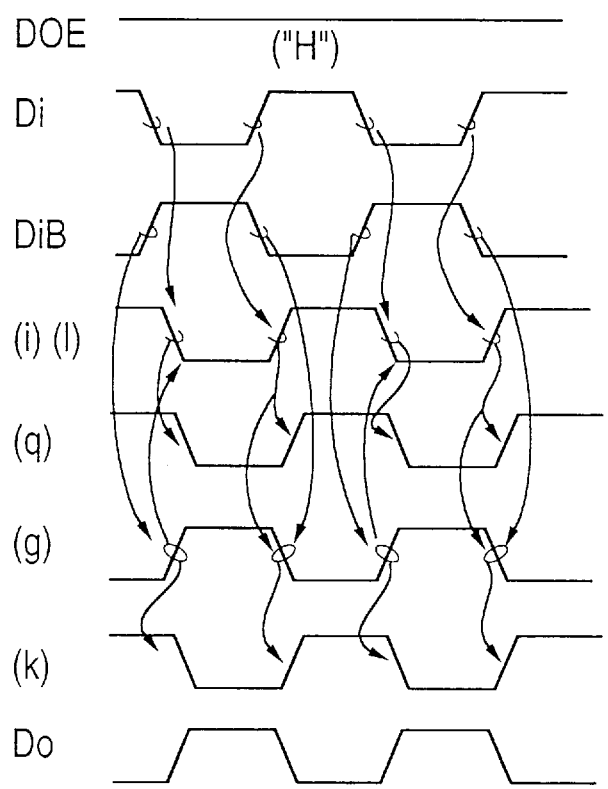
FIG. 9 is a timing chart for describing the operation of the output buffer circuit shown in FIG. 8.

The components other than the fourth and fifth inverters 21 and 22 and the addition output PMOS transistor 23 additionally provided in the present embodiment are similar in circuit operation to those employed in the second embodiment. Operations of the additionally provided components will be described below. FIG. 9 is a timing chart for describing the operation of the output buffer circuit shown in FIG. 8. This drawing is one in which a waveform obtained at an internal node (q) has been added to the timing chart shown in FIG. 5.

When a first input signal Di changes from "H" to "L" and the level at a node (i) changes from "H" to "L", the level at the node (q) changes from "H" to "L", so that the addition output PMOS transistor 23 is turned ON. At this time, the timing provided to turn ON the addition output PMOS transistor 23 lags behind that provided to turn ON the output PMOS transistor 6 owing to a delay in signal by the fourth and fifth inverters 21 and 22.

According to the fourth embodiment as described above, power noise can be reduced by causing the two output PMOS transistors 6 and 23 to distribute, on a time basis, a current that flows when an output signal Do changes from "L" to "H".

According to the output buffer circuit of the present invention, as has been described above, the NAND gate can directly drive the output PMOS transistor while the through-current flow produced in the output MOS transistors is being limited in the same level as ever. Thus, the output buffer circuit has an advantageous effect in that the access for the transition of the output signal from "L" to "H" can be speeded up.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An output buffer circuit comprising:

a first input terminal receiving a first input signal;

a second input terminal receiving a second input signal;

a control input terminal receiving a control signal;

an output terminal outputting an output signal;

a first gate circuit having a first input node coupled to receive the first input signal, a second input node coupled to receive the control signal, an enable input node coupled to receive the second input signal and an output node, the first gate circuit outputting the signal received by the enable input node when the signals received by the first and second input nodes have predetermined level;

a second gate circuit having a first input node coupled to receive the second input signal, a second input node coupled to receive the control signal, an enable input node coupled to receive the first input signal and a output node, the second gate circuit outputting the signal received by the enable input node when the signal received by the first and second input nodes have the predetermined level;

a first transistor having a first terminal coupled to the output terminal, a second terminal coupled to a first potential source, and a control terminal coupled to receive a signal output from the output node of said first gate circuit;

a second transistor having a first terminal coupled to the output terminal, a second terminal coupled to a second potential source and control terminal coupled to receive a signal output from the output node of said second gate circuit;

a third transistor having a first terminal coupled to the output terminal, a second terminal coupled to the first potential source, and a control terminal; and a delay circuit coupled between the output node of first gate circuit and the control terminal of said third transistor.

2. An output buffer circuit according to claim 1, wherein said first and second gate circuits are NAND circuits.

3. An output buffer circuit according to claim 2, wherein each of the NAND circuits comprises a fourth transistor having a first terminal coupled to the first potential source, a second terminal coupled to the output node and a control terminal coupled to the first input node, a fifth transistor having a first terminal coupled to the first potential source, a second terminal coupled to the output node and a control terminal coupled to the second input node, a sixth transistor having a first terminal coupled to the output node, a second terminal, and a control terminal coupled to the second input node, and a seventh transistor having a first terminal coupled to the second terminal of the sixth transistor, a second terminal coupled to receive the control signal and a control terminal coupled to the first input node.

4. An output buffer circuit according to claim 1, further comprising a signal level converting circuit coupled between the output node of said second gate circuit and the control terminal of said second transistor.

5. An output buffer circuit according to claim 1, wherein said first and second gate circuits each include a fourth transistor which has a gate, a source and a drain, the first input node being coupled to the gate of the fourth transistor, the enable input node being coupled to the source of the fourth transistor so as to be coupled to the output node through the a fourth transistor, wherein said first and second gate circuits each include a fifth transistor which has a gate, a source and a drain, the second input node being coupled to the gate of the fifth transistor, the enable input node being coupled to the source of the fifth transistor so as to be coupled to the output node through the fifth transistor, wherein said first and second gate circuits each include a sixth transistor which has a gate, a source and a drain, the second input node being coupled to the gate of the sixth transistor, the drain of the sixth transistor being coupled to the output node, and wherein said first and second gate circuits include a seventh transistor which has a gate, a source and a drain, the first input node being coupled to the gate of the seventh transistor, the drain of the seventh transistor being coupled to the source of the sixth transistor, the enable input node being coupled to the source of one of the seventh transistor so as to be coupled to the output node through the seventh and at least one sixth transistors.

6. An output buffer circuit according to claim 1, wherein said first and second transistors are PMOS and NMOS transistors, respectively, the gate of the first transistor is connected to the output node of the first gate circuit, and the gate of the second transistor is connected to the output node of the second gate circuit through an inverter.

7. An output buffer circuit comprising:
a first input terminal receiving a first input signal;
a second input terminal receiving a second input signal;
a control input terminal receiving a control signal;
an output terminal outputting an output signal;
a first transistor having a first terminal coupled to the output terminal, a second terminal coupled to a first potential source and a control terminal;
a second transistor having a first terminal coupled to the output terminal, a second terminal coupled to a second potential source and a control terminal;
a first gate circuit having a first input node coupled to receive the first input signal, a second input node coupled to receive the control signal, a third input node and an output node;
a second gate circuit having a first input node coupled to receive the second input signal, a second input node coupled to receive the control signal, a third input node coupled to the output node of said first gate circuit and an output node coupled to the control terminal of said second transistor and the third input node of said first gate circuit; and
a third gate circuit having a first input node coupled to receive the first input signal, a second input node coupled to receive the control signal, a third input node coupled to the third input node of said first gate circuit and an output node coupled to the control terminal of said second transistor.

8. An output buffer circuit according to claim 7, wherein said first, second and third gate circuits are NAND circuits.

9. An output buffer circuit according to claim 7, further comprising a signal level converting circuit coupled between the output node of said second gate circuit and the control terminal of said second transistor.

10. An output buffer circuit according to claim 7, further comprising
a third transistor having a first terminal coupled to the output terminal, a second terminal coupled to the first potential source, and a control terminal and
a delay circuit coupled between the output node of said first gate circuit and the control terminal of said third transistor.

11. An output buffer circuit comprising:
a first input terminal receiving a first input signal;
a second input terminal receiving a second input signal;
a control input terminal receiving a control signal;
an output terminal outputting an output signal;
a first transistor having a first terminal coupled to the output terminal, a second terminal coupled to a first potential source and a control terminal;
a second transistor having a first terminal coupled to the output terminal, a second terminal coupled to a second potential source and a control terminal;
a first gate circuit including a plurality of third transistors each of which has a gate, a source and a drain, and having a first input node coupled to receive the first input signal, a second input node coupled to receive the control signal, an enable input node coupled to receive the second input signal and an output node coupled to the control terminal of said first transistor, the first and second input nodes being coupled to the gates of the third transistors, the enable input node being coupled to the source of one of the third transistors, the enable input node being coupled to the output node through at least one of the third transistors; and
a second gate circuit including a plurality of fourth transistors each of which has a gate, a source and a drain, and having a first input node coupled to receive the second input signal, a second input node coupled to receive the control signal, an enable input node coupled to receive the first input signal and an output node coupled to the control terminal of said second transistor, the first and second input nodes being coupled to the gates of the fourth transistors, the enable input node being coupled to the source of one of the fourth transistors, the enable input node being coupled to the output node through the fourth transistor.

12. An output buffer circuit according to claim 11, wherein said first and second gate circuits are NAND circuits.

13. An output buffer circuit according to claim 12, wherein each of the NAND circuits comprises
a fifth transistor having a first terminal coupled to the first potential source, a second terminal coupled to the output node and a control terminal coupled to the first input node,
a sixth transistor having a first terminal coupled to the first potential source, a second terminal coupled to the output node and a control terminal coupled to the second input node,
a seventh transistor having a first terminal coupled to the output node, a second terminal and a control terminal coupled to the second input node, and
an eighth transistor having a first terminal coupled to the second terminal of the seventh transistor, a second terminal coupled to receive the control signal and a control terminal coupled to the second input node.

14. An output buffer circuit according to claim 11, further comprising a signal level converting circuit coupled between the output node of said second gate circuit and the control terminal of said second transistor.

15. An output buffer circuit according to claim 11, further comprising
a fifth transistor having a first terminal coupled to the output terminal, a second terminal coupled to the first potential source, and a control terminal and
a delay circuit coupled between the output node of said first gate circuit and the control terminal of said fifth transistor.

* * * * *